(12) United States Patent
Park et al.

(10) Patent No.: US 7,679,543 B2
(45) Date of Patent: Mar. 16, 2010

(54) CURRENT SAMPLING MIXER WITH HARMONIC REJECTION

(75) Inventors: Kyoung Seok Park, Gyunggi-do (KR); Nam Heung Kim, Gyunggi-do (KR); Gyu Suck Kim, Seoul (KR)

(73) Assignee: Samsung Electro-Mechanics Co., Ltd., Suwon, Kyungki-Do (KR)

( * ) Notice: Subject to any disclaimer, the term of this patent is extended or adjusted under 35 U.S.C. 154(b) by 0 days.

(21) Appl. No.: 12/200,923

(22) Filed: Aug. 28, 2008

(65) Prior Publication Data
US 2009/0251350 A1    Oct. 8, 2009

(30) Foreign Application Priority Data
Apr. 2, 2008    (KR) ............... 10-2008-0030793

(51) Int. Cl.
*H03M 1/12*    (2006.01)
(52) U.S. Cl. ........................ 341/172; 327/175
(58) Field of Classification Search .......... 341/170–175
See application file for complete search history.

(56) References Cited

U.S. PATENT DOCUMENTS

| | | | |
|---|---|---|---|
| 6,839,015 B1 * | 1/2005 | Sutardja et al. | 341/172 |
| 6,850,747 B1 | 2/2005 | Imbornone et al. | |
| 6,967,610 B1 * | 11/2005 | Sutardja et al. | 341/172 |
| 7,023,254 B2 | 4/2006 | Choi et al. | |

* cited by examiner

*Primary Examiner*—Lam T Mai
(74) *Attorney, Agent, or Firm*—Lowe Hauptman Ham & Berner

(57) ABSTRACT

Provided is a current sampling mixer that can be applied to a broadband broadcasting system. The current sampling mixer can change a structure of a current sampler including a plurality of capacitors to select and sum capacitors having a weight value given in the output, thereby performing a finite impulse response filter function and a harmonic rejection function.

24 Claims, 10 Drawing Sheets

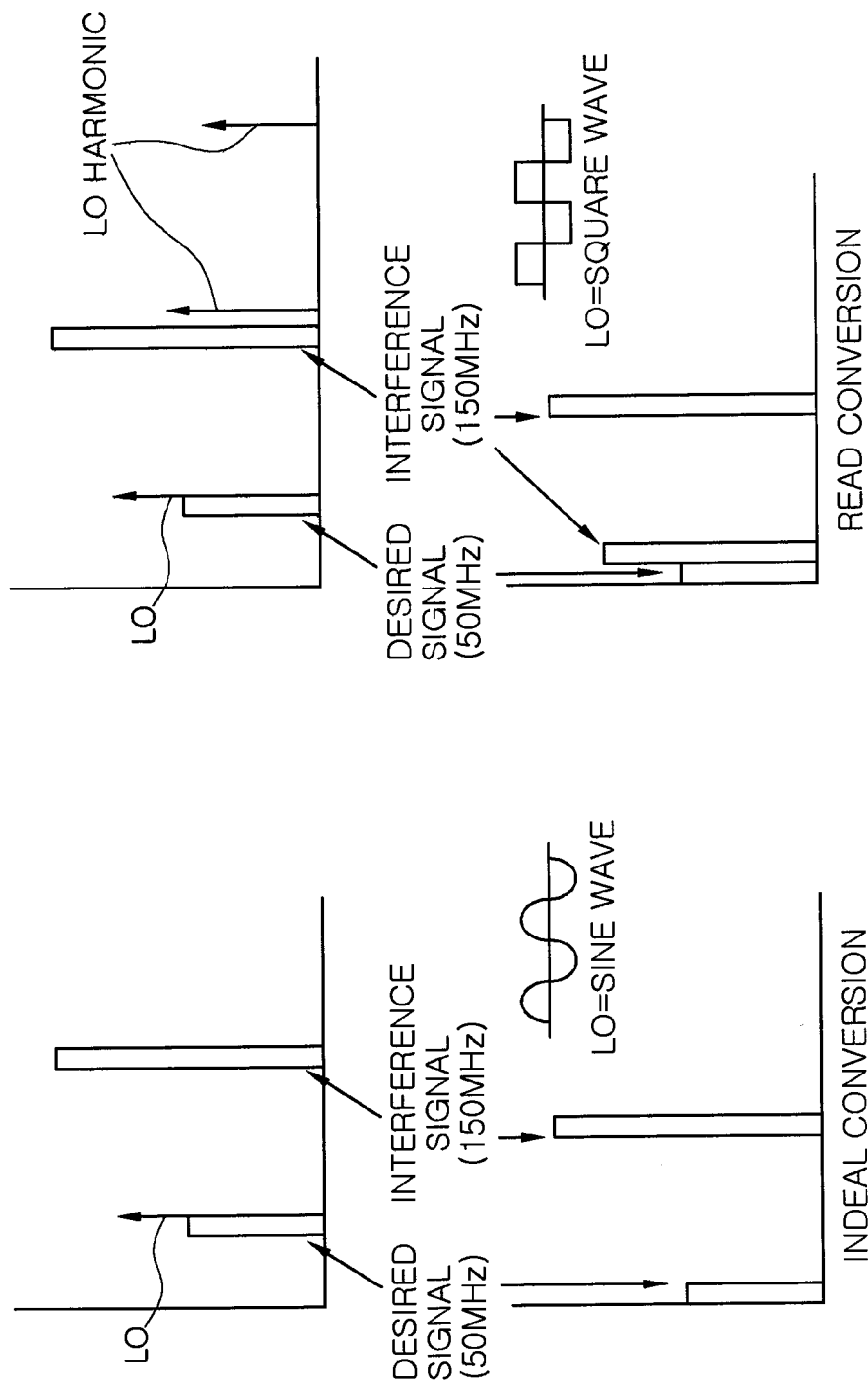

CURRENT SAMPLING MIXER WITH HARMONIC REJECTION

CROSS-REFERENCE TO RELATED APPLICATIONS

This application claims the priority of Korean Patent Application No. 2008-30793 filed on Apr. 2, 2008 in the Korean Intellectual Property Office, the disclosure of which is incorporated herein by reference.

BACKGROUND OF THE INVENTION

1. Field of the Invention

The present invention relates to a current sampling mixer capable of being applied to a broadband broadcasting system, and more particularly, to a current sampling mixer with harmonic rejection mixer (HMR) function which can change a structure of a current sampler including a plurality of capacitors to select and sum capacitors having a weight value given in the output, thereby performing a finite impulse response filter function and a harmonic rejection function.

2. Description of the Related Art

In general, in a broadband broadcasting system, there may exist other channels or interruption signals in a region corresponding to the harmonic of a desired signal.

Meanwhile, a current sampler uses a scheme which sequentially stores continual samples in a plurality of capacitors while converting a radio frequency (RF) signal into a desired intermediate frequency (IF) signal, and implements a finite impulse response filter and characteristics through a process that simultaneously outputs the samples stored in the capacitors.

Such a current sampler has harmonic conversion characteristics as illustrated in FIG. 1.

FIG. 1A is a description diagram of an ideal signal conversion. FIG. 1B is a description diagram of a real signal conversion.

Referring to FIG. 1A, in a current sampling process of the current sampler, if a desired signal and an interference signal are converted by an oscillation signal LO when there is no harmonic of the oscillation signal LO ideally, the converted signal do not include an interruption signal.

Referring to FIG. 1B, in a current sampling process of the current sampler, since there exists a harmonic of the oscillation signal LO substantially, the converted interference signal is included in the converted desired signal when the interference signal of a desired RF signal takes a conversion process by the harmonic of the oscillation signal LO. Accordingly, the interference signal of a desired RF signal operates as an interruption signal against a desired signal.

FIG. 2A is a concept diagram of the related art switching mixer. FIG. 2B is a concept diagram of the related art harmonic rejection mixer. FIG. 2C is a concept diagram of a generation of a multi-phase oscillation signal LO.

Referring to FIG. 2A, in a case where an oscillation signal LO of a square wave is used in a signal conversion, if the fast Fourier transform (FFT) of the oscillation signal LO of the square wave is performed and a frequency component is checked, it can be seen that the FFT performed oscillation signal (FLO) includes a plurality of frequency components. Accordingly, if a RF signal is converted using the square wave oscillation signal LO, an IF signal and a plurality of IF harmonics are generated.

To reject the harmonic of the oscillation signal, the related art harmonic rejection mixer may be configured as illustrated in FIG. 3.

FIG. 3 is a block diagram of the related art harmonic rejection mixer.

Referring to FIG. 3, the related art harmonic rejection mixer includes an output load unit 10 connected to a power supply terminal Vcc, and first to third mixing circuit units 21 to 23 which are connected to the output load unit 10 in parallel and have a Gilbert Cell structure.

The first mixing circuit unit 21 includes gain stages M15 and M16 for receiving an input signal RFin, and switch stages M11 to M14 for switching the input signal RFin from the gain stages M15 and M16 according to a first oscillation signal LO1, mixing the input signal RFin with the first oscillation signal LO1 and outputting them through the output load unit 10.

The second mixing circuit unit 22 includes gain stages M25 and M26 for receiving an input signal RFin, and switch stages M21 to M24 for switching the input signal RFin from the gain stages M25 and M26 according to a second oscillation signal LO2, mixing the input signal RFin with the second oscillation signal LO2 and outputting them through the output load unit 10.

The third mixing circuit unit 23 includes gain stages M35 and M36 for receiving an input signal RFin, and switch stages M31 to M34 for switching the input signal RFin from the gain stages M35 and M36 according to a third oscillation signal LO3, mixing the input signal RFin with the third oscillation signal LO3 and outputting them through the output load unit 10.

As illustrated in FIG. 2C, since the first oscillation signal LO1, the second oscillation signal LO2 and the third oscillation signal LO3 have different phases, an oscillation signal which is the sum of the first to third oscillation signals LO1 to LO3 has a multi-phase.

Each of the gain stages of the first to third mixing circuit units 21 to 23 provides a weight to a corresponding switch stage to exert an influence on the oscillation signal of the multi-phase.

The related art multi-phase harmonic rejection mixer of FIGS. 2 and 3 uses a scheme which rejects a harmonic component and a scheme which shares the output load unit 10 via the use of a multi-phase of a rectangular wave oscillation signal LO. Herein, since the multi-phase takes charge of a portion associated with a phase and the gain stages of each of the mixing circuit units take charge of a portion corresponding to a weight value, the sum of signals produces an effect such as the multiplication of sine wave oscillation signals LO.

In this way, the related art harmonic rejection mixer of FIGS. 2 and 3 may be applied to a continuous analog type system to reject a harmonic, but cannot be applied to a discrete analog system.

SUMMARY OF THE INVENTION

An aspect of the present invention provides a current sampling mixer with harmonic rejection mixer (HRM) function which can change a structure of a current sampler including a plurality of capacitors to select and sum capacitors having a weight value given in the output, thereby performing a finite impulse response filter function and a harmonic rejection function.

According to an aspect of the present invention, there is provided a current sampling mixer with harmonic rejection, including: a first current source connected to a first input terminal to provide a positive current of an input signal; a second current source connected to a second input terminal to provide a negative current of the input signal; a charge selector including a plurality of charge switches connected to the respective first and second current sources in parallel, wherein the charge switches are sequentially turned on during a charge time and are simultaneously turned off during a sum output time; a capacitor circuit including a plurality of capacitor pairs connected to the respective chare switches, wherein each of the capacitor pairs includes a pre-capacitor and a post-capacitor; a weight selector including a plurality of weight switches connected to a current path between the pre-capacitor and post-capacitor of each of the capacitor pairs, wherein the weight switches are turned on during the charge time and are turned off for giving a weight during the sum output time; and a filter circuit including a plurality of output switches connected between the respective post-capacitors of the capacitor circuit and an output terminal, wherein the output switches are simultaneously turned on for a sum output during the sum output time.

According to another aspect of the present invention, there is provided a current sampling mixer with harmonic rejection, including: a first current source connected to a first input terminal to provide the positive current of an input signal; a second current source connected to a second input terminal to provide a negative current of the input signal; a charge selector including a plurality of charge switches connected to the respective first and second current sources in parallel, wherein the charge switches are sequentially turned on during a charge time and are simultaneously turned off during a sum output time; a capacitor circuit including a plurality of capacitor pairs connected to the respective chare switches, wherein each of the capacitor pairs includes a pre-capacitor and a post-capacitor; a weight selector including a plurality of weight switches connected to a current path between the pre-capacitor and post-capacitor of each of the capacitor pairs, wherein the weight switches are turned on during the charge time and are turned off for giving a weight during the sum output time; a filter circuit including a plurality of output switches connected between the respective post-capacitors of the capacitor circuit and an output terminal, wherein the output switches are simultaneously turned on for a sum output during the sum output time; and a reset circuit configured to reset the capacitor pairs of the capacitor circuit during between the sum output time and the charge time.

According to still another aspect of the present invention, there is provided a current sampling mixer with harmonic rejection, including: a first current source connected to a first input terminal to provide the positive current of an input signal; a second current source connected to a second input signal; a charge selector including a plurality of charge switches connected to the respective first and second current sources in parallel, wherein the charge switches are sequentially turned on during a charge time and are simultaneously turned off during a sum output time; a capacitor circuit including a plurality of capacitor pairs connected to the respective chare switches, wherein each of the capacitor pairs includes a pre-capacitor and a post-capacitor; a weight selector including a plurality of weight switches connected to a current path between the pre-capacitor and post-capacitor of each of the capacitor pairs, wherein the weight switches are turned on during the charge time and are turned off for giving a weight during the sum output time; a filter circuit including a plurality of output switches connected between the respective post-capacitors of the capacitor circuit and an output terminal, wherein the output switches are simultaneously turned on for a sum output during the sum output time; a reset circuit configured to reset the capacitor pairs of the capacitor circuit during between the sum output time and the charge time; and a switch controller configured to generate a charge selection signal which sequentially switches on the charge switches during the charge time, generate a weight selection signal which switches on the weight switches during the charge time and switches off the weight switches at the sum output time after the charge time, generate an output selection signal which simultaneously switches on the output switches during the sum output time, and generate a reset signal during between the sum output time and the charge time, to output the generated signals.

According to still another aspect of the present invention, there is provided a current sampling mixer with harmonic rejection, including: a first current source connected to a first input terminal to provide the positive current of an input signal; a second current source connected to a second input terminal to provide a negative current of the input signal; a charge selector including a plurality of charge switches connected to the respective first and second current sources in parallel, wherein the charge switches are sequentially turned on during a charge time and are simultaneously turned off during a sum output time; a capacitor circuit including a plurality of capacitor pairs connected to the respective chare switches, wherein each of the capacitor pairs includes a pre-capacitor and a post-capacitor; a weight selector including a plurality of weight switches connected to a current path between the pre-capacitor and post-capacitor of each of the capacitor pairs, wherein the weight switches are turned on during the charge time and are turned off for giving a weight during the sum output time; a filter circuit including a plurality of output switches connected between the respective post-capacitors of the capacitor circuit and an output terminal, wherein the output switches are simultaneously turned on for a sum output during the sum output time; a reset circuit configured to reset the capacitor pairs of the capacitor circuit during between the sum output time and the charge time; and a switch controller configured to generate a charge selection signal which sequentially switches on the charge switches during the charge time, generate a weight selection signal which switches on the weight switches during the charge time and switches off the weight switches at the sum output time after the charge time, generate an output selection signal which simultaneously switches on the output switches during the sum output time, and generate a reset signal during between the sum output time and the charge time, to output the generated signals, wherein the post-capacitors of the capacitor pairs have a weight value corresponding to an absolute value of a sine wave of one period in disposition order.

According to still another aspect of the present invention, there is provided a current sampling mixer with harmonic rejection, including: a first current source connected to a first input terminal to provide the positive current of an input signal; a second current source connected to a second input terminal to provide a negative current of the input signal; a first current sampling mixer including a plurality of first capacitor pairs connected to the respective first and second current sources in parallel, wherein the first current sampling mixer charges the first capacitor pairs during a first charge time, selects weight charge values of charge values which are charged in the first capacitor pairs during a second charge time after the first charge time, and outputs the selected weight charge values; a second current sampling mixer including a plurality of second capacitor pairs connected to the respective first and second current sources in parallel, wherein the second current sampling mixer charges the second capacitor pairs during the second charge time, selects weight charge values of charge values which are charged in the second capacitor pairs during the first charge time, and outputs the selected weight charge values; and a switch controller configured to simultaneously control the charge of the first current sampling mixer and the sum output of the second current sampling mixer during the first charge time, and simultaneously control the sum output of the first current sampling mixer and the charge of the second current sampling mixer during the second charge time.

Each of the first and second current sampling mixer includes: a charge selector including a plurality of charge switches connected to the respective first and second current sources in parallel, wherein the charge switches are sequentially turned on during a charge time and are simultaneously turned off during a sum output time; a capacitor circuit including a plurality of capacitor pairs connected to the respective chare switches, wherein each of the capacitor pairs includes a pre-capacitor and a post-capacitor; a weight selector including a plurality of weight switches connected to a current path between the pre-capacitor and post-capacitor of each of the capacitor pairs, wherein the weight switches are turned on during the charge time and are turned off for giving a weight during the sum output time; and a filter circuit including a plurality of output switches connected between the respective post-capacitors of the capacitor circuit and an output terminal, wherein the output switches are simultaneously turned on for a sum output during the sum output time.

The first current sampling mixer includes a first reset circuit configured to reset the capacitor pairs of the capacitor circuit during between the sum output time and the charge time, and the second current sampling mixer includes a second reset circuit configured to reset the capacitor pairs of the capacitor circuit during between the sum output time and the charge time.

The switch controller generates a charge selection signal which sequentially switches on the charge switches of the charge selector of the first current sampling mixer and simultaneously generates a weight selection signal which switches on the weight switches of the weight selector of the first current sampling mixer, during the first charge time, generates an output selection signal which simultaneously switches on the output switches of the filter circuit of the first current sampling mixer and simultaneously outputs the weight selection signal as a switch off signal, during the second charge time, and generates and outputs a reset signal during between the sum output time and the charge time.

The current sampling mixer further includes an output capacitor connected to the output terminal.

The capacitor pairs have the same capacitance.

The post-capacitors of the capacitor pairs have a weight value corresponding to an absolute value of a sine wave of one period in disposition order.

Each of the weight values of the post-capacitors corresponds to an absolute value of the same phase difference interval in the sine wave of one period.

BRIEF DESCRIPTION OF THE DRAWINGS

The above and other aspects, features and other advantages of the present invention will be more clearly understood from the following detailed description taken in conjunction with the accompanying drawings, in which:

FIG. 1A is a description diagram of an ideal signal conversion;

FIG. 1B is a description diagram of a real signal conversion;

DETAILED DESCRIPTION OF THE PREFERRED EMBODIMENT

Figure 2A:
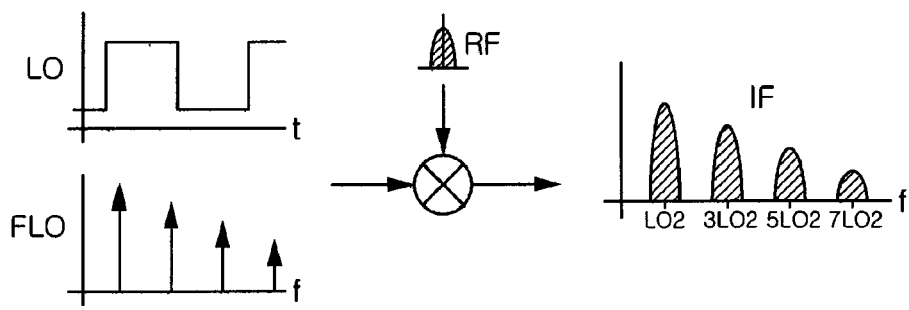
FIG. 2A is a concept diagram of the related art switching mixer.
Figure 2B:
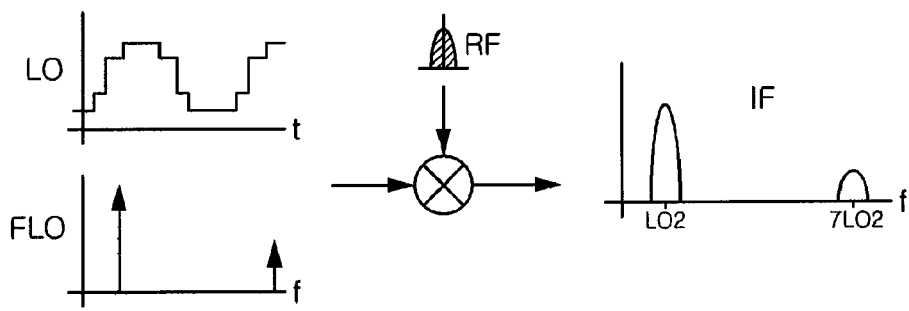
FIG. 2B is a concept diagram of the related art harmonic rejection mixer.
Figure 2C:
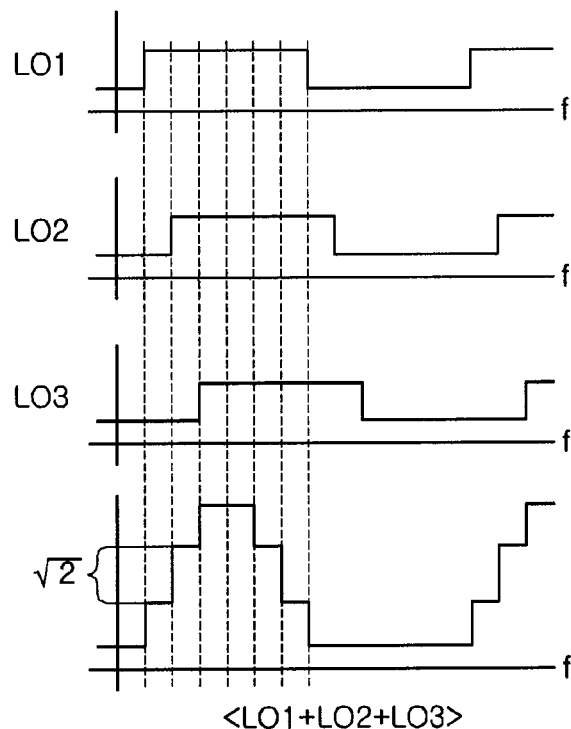
FIG. 2C is a concept diagram of a generation of a multi-phase oscillation signal LO.
Figure 3:
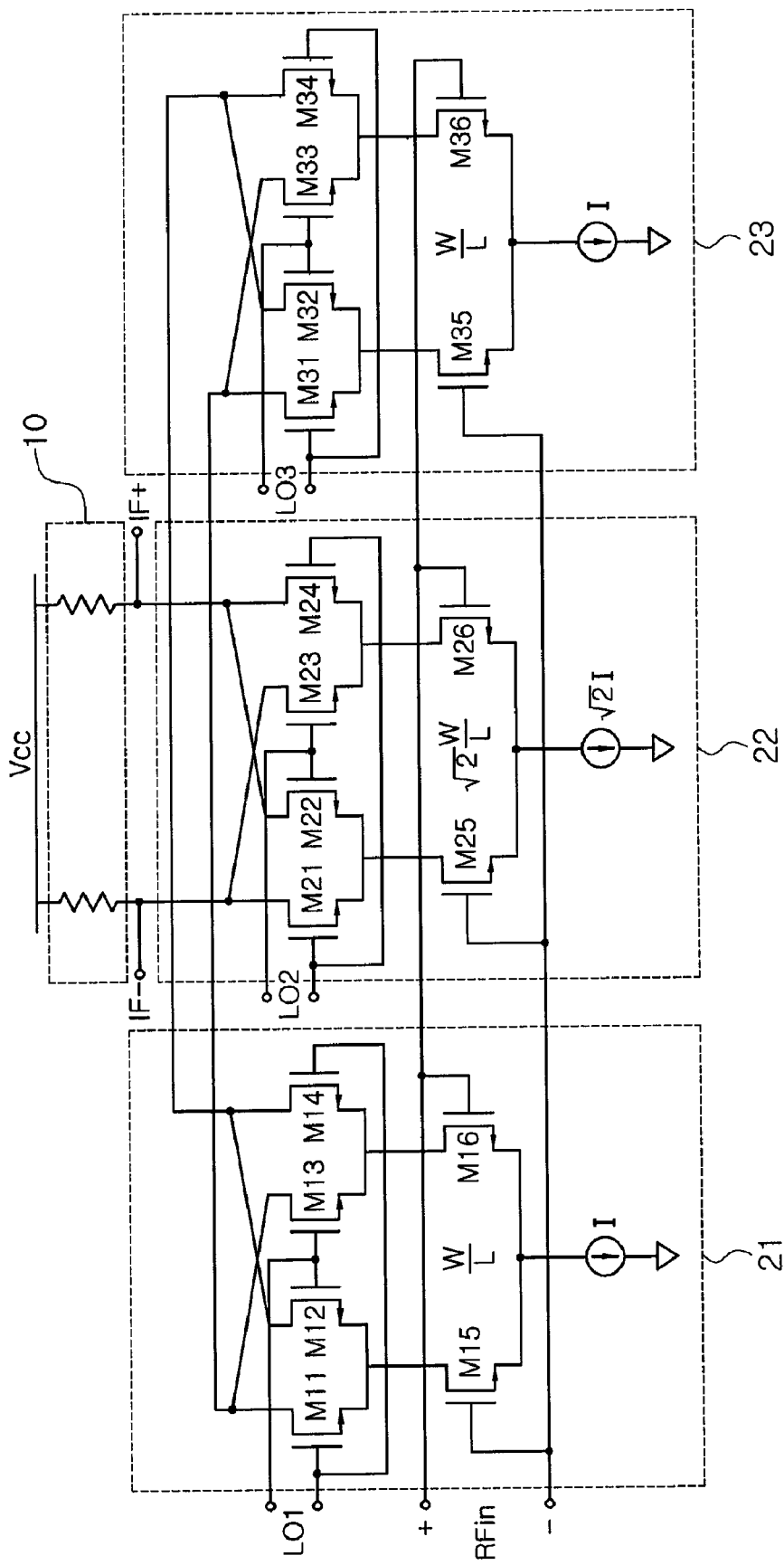
FIG. 3 is a block diagram of the related art harmonic rejection mixer.

Exemplary embodiments of the present invention will now be described in detail with reference to the accompanying drawings.

The present invention is not limited to the following embodiments, and embodiments of the present invention are used for the understanding the technical spirit of the present invention. Like reference numerals are used to refer to elements having the substantially same configuration and function.

Figure 4:
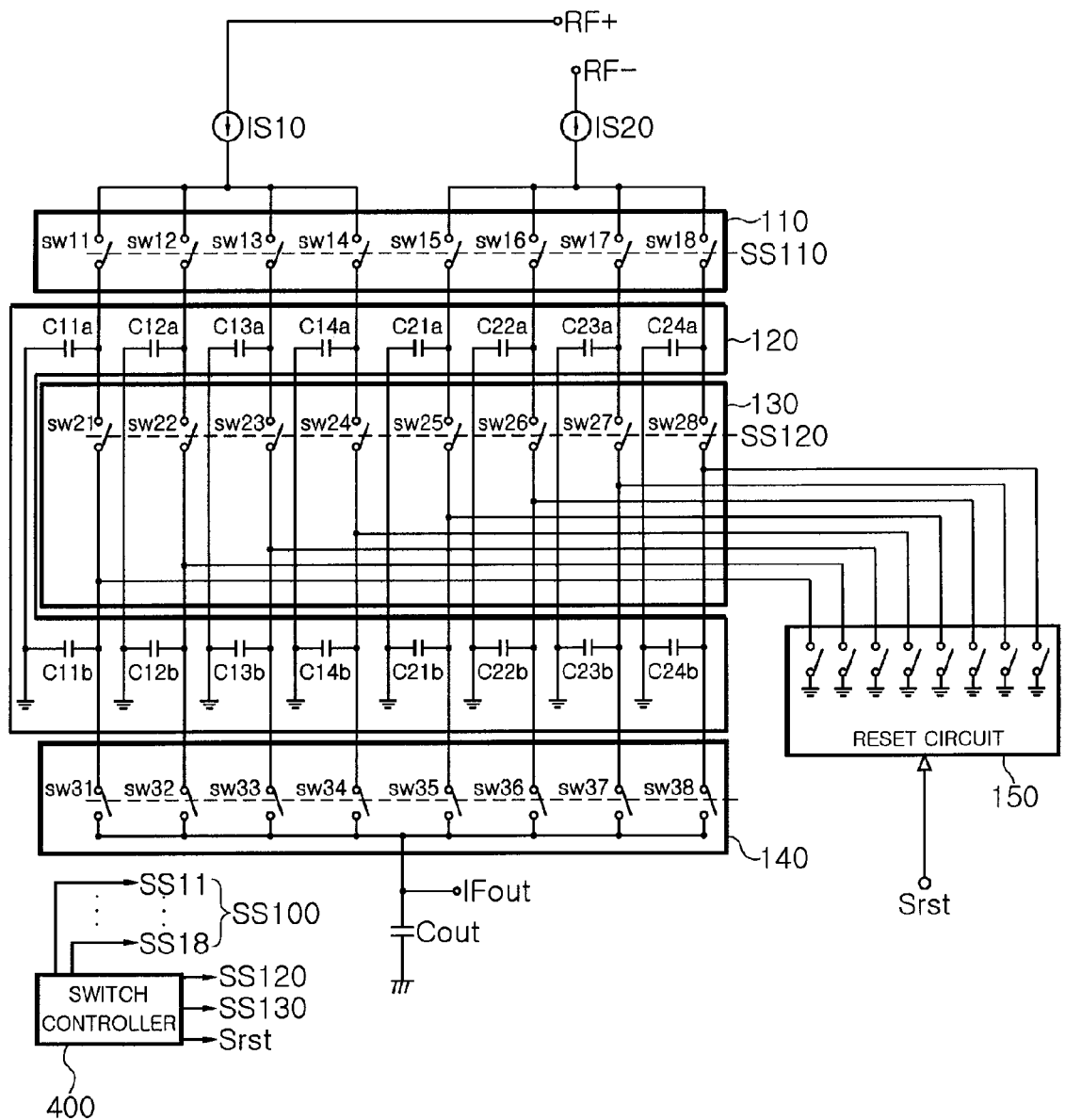
FIG. 4 is a block diagram of a current sampling mixer according to an embodiment of the present invention.

FIG. 4 is a block diagram of a current sampling mixer according to an embodiment of the present invention.

Referring to FIG. 4, a current sampling mixer according to the present invention includes a first current source IS10 connected to a first input terminal RF+ to provide the positive current of an input signal, a second current source IS20 connected to a second input terminal RF− to provide the negative current of the input signal, a charge selector 110 including a plurality of charge switches connected to the respective first and second current sources IS10 and IS20 in parallel, wherein the charge switches are sequentially turned on during a charge time and are simultaneously turned off during a sum output time, a capacitor circuit 120 including a plurality of capacitor pairs connected to the respective chare switches, wherein each of the capacitor pairs includes a pre-capacitor and a post-capacitor, a weight selector 130 including a plurality of weight switches connected to a current path between the pre-capacitor and post-capacitor of each of the capacitor pairs, wherein the weight switches are turned on during the charge time and are turned off for giving a weight during the sum output time, and a filter circuit 140 including a plurality of output switches connected between the respective post-capacitors of the capacitor circuit and an output terminal IFout, wherein the output switches are simultaneously turned on for a sum output during the sum output time.

The current sampling mixer of the present invention may include a reset circuit 150 for resetting the capacitor pairs of the capacitor circuit during between the sum output time and the charge time.

In addition, the current sampling mixer of the present invention may include a switch controller 400 for generating a plurality of charge selection signals SS110 which sequentially switch on the charge switches during the charge time, generating a weight selection signal SS120 which switches on the weight switches during the charge time and switches off the weight switches at the sum output time after the charge time, generating an output selection signal SS130 which simultaneously switches on the output switches during the sum output time, and generating a reset signal Srst during between the sum output time and the charge time, to output them.

Meanwhile, the reason that the respective first and second current sources IS10 and IS20 provide the positive current and negative current of the input signal is for implementing the positive component of the sine wave and the negative component of the sine wave.

The pre-capacitor of each of the capacitor pairs may be configured with one or more capacitors. Moreover, the post-capacitor of each of the capacitor pairs may be configured with one or more capacitors.

The current sampling mixer of the present invention may include an output capacitor Cout connected to the output terminal IFout.

Each of the capacitor pairs may have the same capacitance. The post-capacitors of the capacitor pairs may have a weight value corresponding to an absolute value of the sine wave of one period in disposition order. Each of the absolute values of the post-capacitors may correspond to the absolute value of the same phase difference interval in the sine wave of one period. At this point, the weight values of the post-capacitors denote a differently set capacitance other than a capacitance which is common to the post-capacitors.

As an example, the capacitor pairs are configured with first to eighth capacitor pairs, each of which includes one post-capacitor. In a case where the post-capacitor is configured with one capacitor, the capacitor circuit 120 may include first to eighth post-capacitors, and the weight selector 130 may also include first to eighth weight switches.

Figure 5:
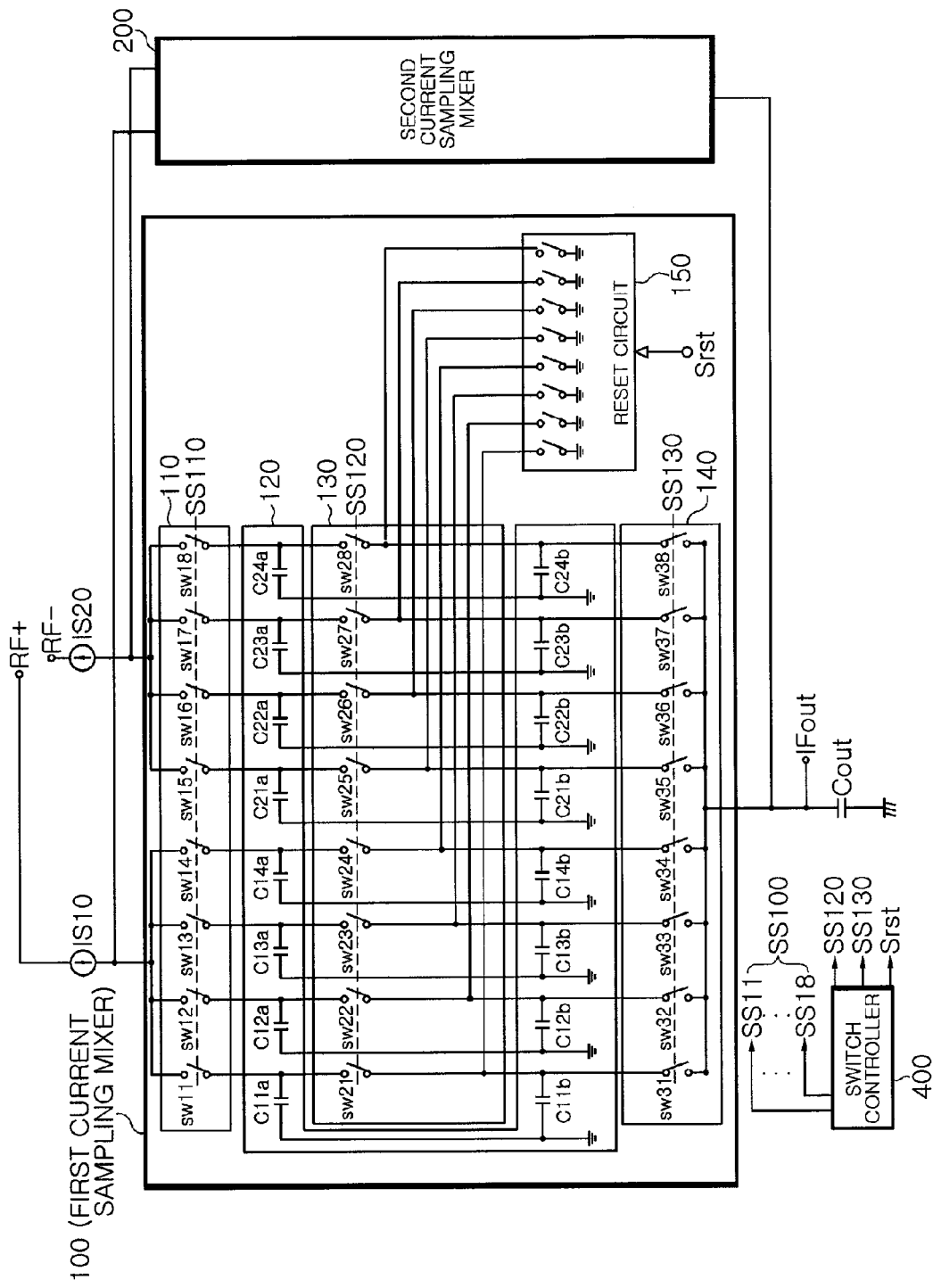
FIG. 5 is a block diagram of a current sampling mixer according to another embodiment of the present invention.

FIG. 5 is a block diagram of a current sampling mixer according to another embodiment of the present invention.

Referring to FIG. 5, a current sampling mixer according to the present invention includes a first current source IS10 connected to a first input terminal RF+ to provide the positive current of an input signal, a second current source IS20 connected to a second input terminal RF− to provide the negative current of the input signal, a first current sampling mixer 100 including a plurality of capacitor pairs connected to the respective first and second current sources IS10 and IS20 in parallel, charging the capacitor pairs during a first charge time, selecting weight charge values of charge values which are charged in the capacitor pairs during a second charge time after the first charge time, and outputting the sum of the selected weight charge values, a second current sampling mixer 200 including a plurality of capacitor pairs connected to the respective first and second current sources IS10 and IS20 in parallel, charging the capacitor pairs during the second charge time, and selecting weight charge values of charge values which are charged in the capacitor pairs during the first charge time, and outputting the sum of the selected weight charge values, and a switch controller 400 for simultaneously controlling the charge of the first current sampling mixer and the sum output of the second current sampling mixer during the first charge time, and simultaneously controlling the sum output of the first current sampling mixer and the charge of the second current sampling mixer during the second charge time.

The first current sampling mixer 100 includes a charge selector 110, a capacitor circuit 120, a weight selector 130, and a filter circuit 140.

Like an embodiment of the present invention, the charge selector 110 includes a plurality of charge switches connected to the respective first and second current sources IS10 and IS20 in parallel, wherein the charge switches are sequentially turned on during a charge time and are simultaneously turned off during a sum output time.

For example, as illustrated in FIG. 4, the charge switches may include first to second charge switches SW11 to SW14 connected to the first current source IS10 in parallel, and fifth to eighth charge switches SW15 to SW18 connected to the second current source IS20 in parallel.

The capacitor circuit 120 includes the capacitor pairs connected to the respective chare switches, wherein each of the capacitor pairs includes a pre-capacitor and a post-capacitor.

For example, in a case where the capacitor pairs are connected to the respective first to eighth charge switches SW11 to SW18 in one-on-one relationship, they may be configured with first to eighth capacitor pairs. That is, the first capacitor pair may be configured with a first pre-capacitor C11a and a first post-capacitor C11b, the second capacitor pair may be configured with a second pre-capacitor C12a and a second post-capacitor C12b, the third capacitor pair may be configured with a third pre-capacitor C13a and a third post-capacitor C13b, the fourth capacitor pair may be configured with a fourth pre-capacitor C14a and a fourth post-capacitor C14b, the fifth capacitor pair may be configured with a fifth pre-capacitor C15a and a fifth post-capacitor C15b, the sixth capacitor pair may be configured with a sixth pre-capacitor C16a and a sixth post-capacitor C16b, the seventh capacitor pair may be configured with a seventh pre-capacitor C17a and a seventh post-capacitor C17b, and the eighth capacitor pair may be configured with a eighth pre-capacitor C18a and a eighth post-capacitor C18b.

The weight selector 130 includes a plurality of weight switches connected to a current path between the pre-capacitor and post-capacitor of each of the capacitor pairs, wherein the weight switches are turned on during the charge time and are turned off for giving a weight during the sum output time.

For example, in a case where the weight switches are connected to a current path between the pre-capacitor and post-capacitor of each of the first to eighth capacitor pairs, the weight switches may be configured with first to eighth weight switches SW21 to SW28.

The filter circuit 140 includes a plurality of output switches connected between the respective post-capacitors of the capacitor circuit 120 and an output terminal, wherein the output switches are simultaneously turned on for a sum output during the sum output time.

For example, in a case where the capacitor circuit 120 is configured with first to eighth capacitor pairs, the output switch may be configured with first to eighth output switches SW31 to SW38 connected between the respective post-capacitors of the first to eighth capacitor pairs and an output terminal.

Moreover, the second current sampling mixer 200 may have the same configuration as that of the first current sampling mixer 100.

The first current sampling mixer 100 includes a reset circuit 150 resetting the capacitor pairs of the capacitor circuit 120 during between the sum output time and the charge time.

Moreover, the second current sampling mixer 200 includes a capacitor circuit (not shown) including a plurality of capacitor pairs (not shown), and it may include a reset circuit (not shown) resetting the capacitor pairs of the capacitor circuit during between the sum output time and the charge time.

The switch controller 400 generates a charge selection signal SS110 which sequentially switches on the charge switches of the charge selector 110 of the first current sampling mixer 100 and simultaneously generates a weight selection signal SS120 which switches on the weight switches of the weight selector 130 of the first current sampling mixer 100, during the first charge time TC1.

The switch controller 400 generates an output selection signal SS130 which simultaneously switches on the output switches of the filter circuit 140 of the first current sampling mixer 100, and simultaneously outputs the weight selection signal SS120 as a switch off signal, during the second charge time TC2. Furthermore, the switch controller 400 generates and outputs a reset signal Srst during between the sum output time and the charge time.

Each of the capacitor pairs has the same capacitance. The post-capacitors of the capacitor pairs have a weight value corresponding to an absolute value of the sine wave of one period in disposition order. Each of the weight values of the post-capacitors corresponds to the absolute value of the same phase difference interval in the sine wave of one period.

Figure 6:
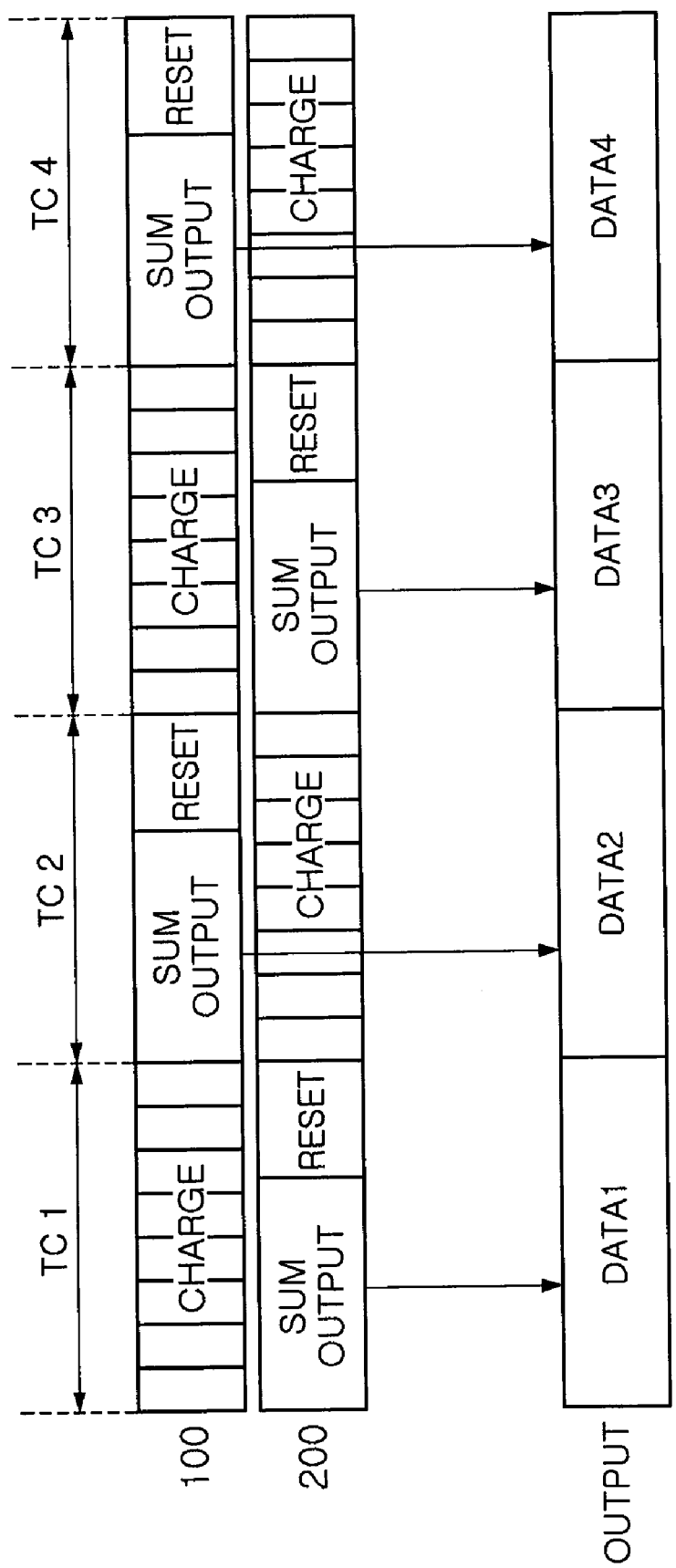
FIG. 6 is a timing diagram illustrating the operation of a current sampling mixer according to another embodiment of the present invention.

FIG. 6 is a timing diagram illustrating the operation of a current sampling mixer according to another embodiment of the present invention.

Referring to FIG. 6, in a case where the current sampling mixer of the present invention includes the first current sampling mixer 100 and the second current sampling mixer 200 as illustrated in FIG. 5, each of the first and second current sampling mixers 100 and 200 sequentially performs a charge operation, an output operation and a reset operation.

For example, during a first charge time TC1 in which the charge operation is performed in the first current sampling mixer 100, the second current sampling mixer 200 sequentially performs a sum output operation and the reset operation. Moreover, during a second charge time TC2 in which the charge operation is performed in the second current sampling mixer 200, the first current sampling mixer 100 sequentially performs a sum output operation and the reset operation.

Figure 7:
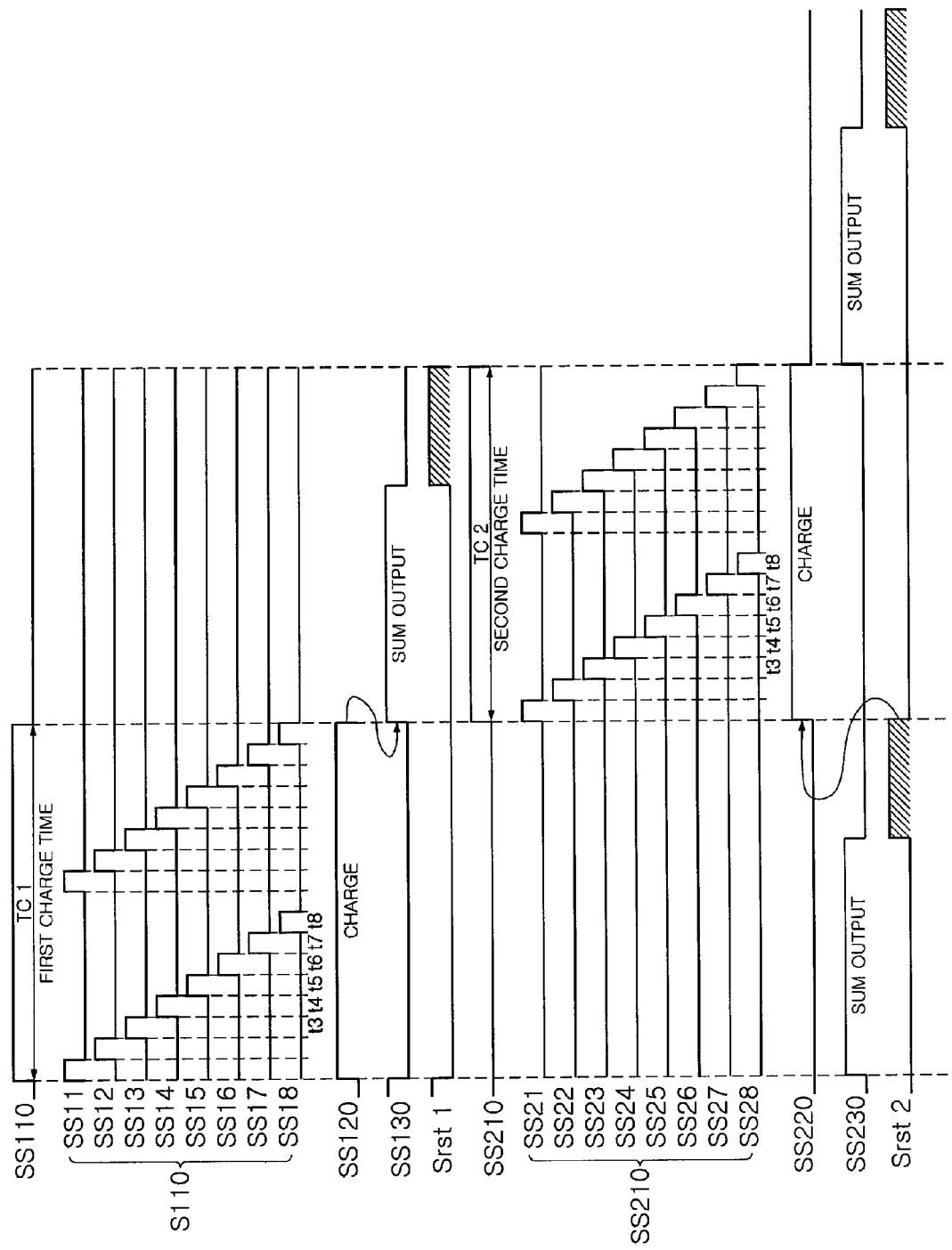
FIG. 7 is a timing chart of a charge selection signal, a weight selection signal and an output selection signal according to the present invention.

FIG. 7 is a timing chart of a charge selection signal, a weight selection signal and an output selection signal according to the present invention.

As shown in FIG. 7, during a first charge time TC1 or a second charge time TC2, when the weight selection signal SS120 has an on level, the chare selection signal SS10 has an on level and the output selection signal SS130 has an off level. On the other hand, when the weight selection signal SS120 has an off level, the charge selection signal SS110 has an off level and the output selection signal SS130 has an on level.

In the current sampling mixer of the present invention, on a case where the charge switch includes the first to eighth charge switches SW11 to SW18, the charge selection signal SS110 will be described with reference to FIG. 7.

Referring to FIG. 7, the SS11 of the charge selection signal SS110 is provided to the first charge switch SW11 of the charge selector 110, the SS12 of the charge selection signal SS110 is provided to the second charge switch SW12 of the charge selector 110, the SS13 of the charge selection signal SS110 is provided to the third charge switch SW13 of the charge selector 110, the SS14 of the charge selection signal SS110 is provided to the fourth charge switch SW14 of the charge selector 110, the SS15 of the charge selection signal SS110 is provided to the fifth charge switch SW15 of the charge selector 110, the SS16 of the charge selection signal SS110 is provided to the sixth charge switch SW16 of the charge selector 110, the SS17 of the charge selection signal SS110 is provided to the seventh charge switch SW17 of the charge selector 110, and the SS18 of the charge selection signal SS110 is provided to the eighth charge switch SW18 of the charge selector 110.

Figure 8:
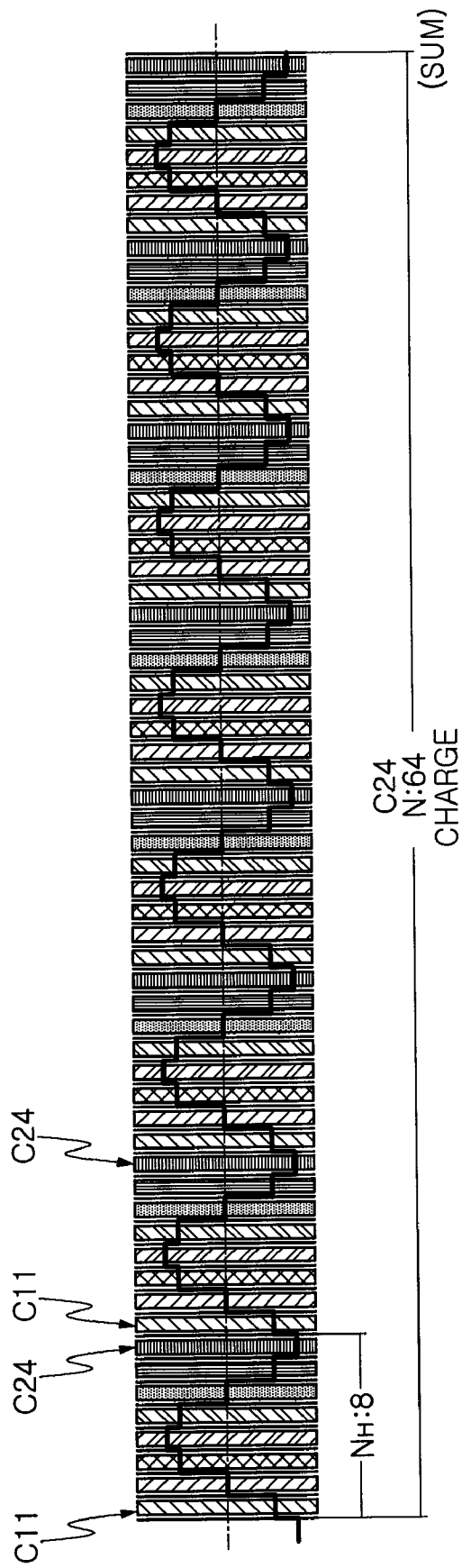
FIG. 8 is a waveform diagram of an output signal by a current sampling mixer according to the present invention.

FIG. 8 is a waveform diagram of an output signal by a current sampling mixer according to the present invention.

As an example referring to FIG. 8, in a case where the capacitor pairs include first to eighth capacitor pairs, the weight selector 130 may include first to eighth post-capacitors C11 to C14 and C21 to C24.

The first to eighth post-capacitors C11 to C14 and C21 to C24 may have a weight value corresponding to an absolute value of the sine wave of one period in disposition order. Each of the weight values of the first to eighth post-capacitors C11 to C14 and C21 to C24 may correspond to the absolute value of the same phase difference (45 degrees) interval in the sine wave of one period.

For example, C11 corresponds to 0 which is the absolute value of $\sin(0°)$, C12 corresponds to $1/\sqrt{2}$ which is the absolute value of $\sin(45°)$, C13 corresponds to 1 which is the absolute value of $\sin(90°)$, and C14 corresponds to $1/\sqrt{2}$ which is the absolute value of $\sin(135°)$. In this case, the positive component of a sine wave is implemented by the first current source IS10 and first to fourth capacitors C11a to C14a and C11b to C14b.

Furthermore, C21 corresponds to 0 which is the absolute value of $\sin(180°)$, C22 corresponds to $1/\sqrt{2}$ which is the absolute value of $\sin(225°)$, C23 corresponds to 1 which is the absolute value of $\sin(270°)$, and C24 corresponds to $1/\sqrt{2}$ which is the absolute value of $\sin(315°)$. In this case, the positive component of a sine wave is implemented by the second current source IS20 and fifth to eighth capacitors C21a to C24a and C21b to C24b.

Figure 9A:
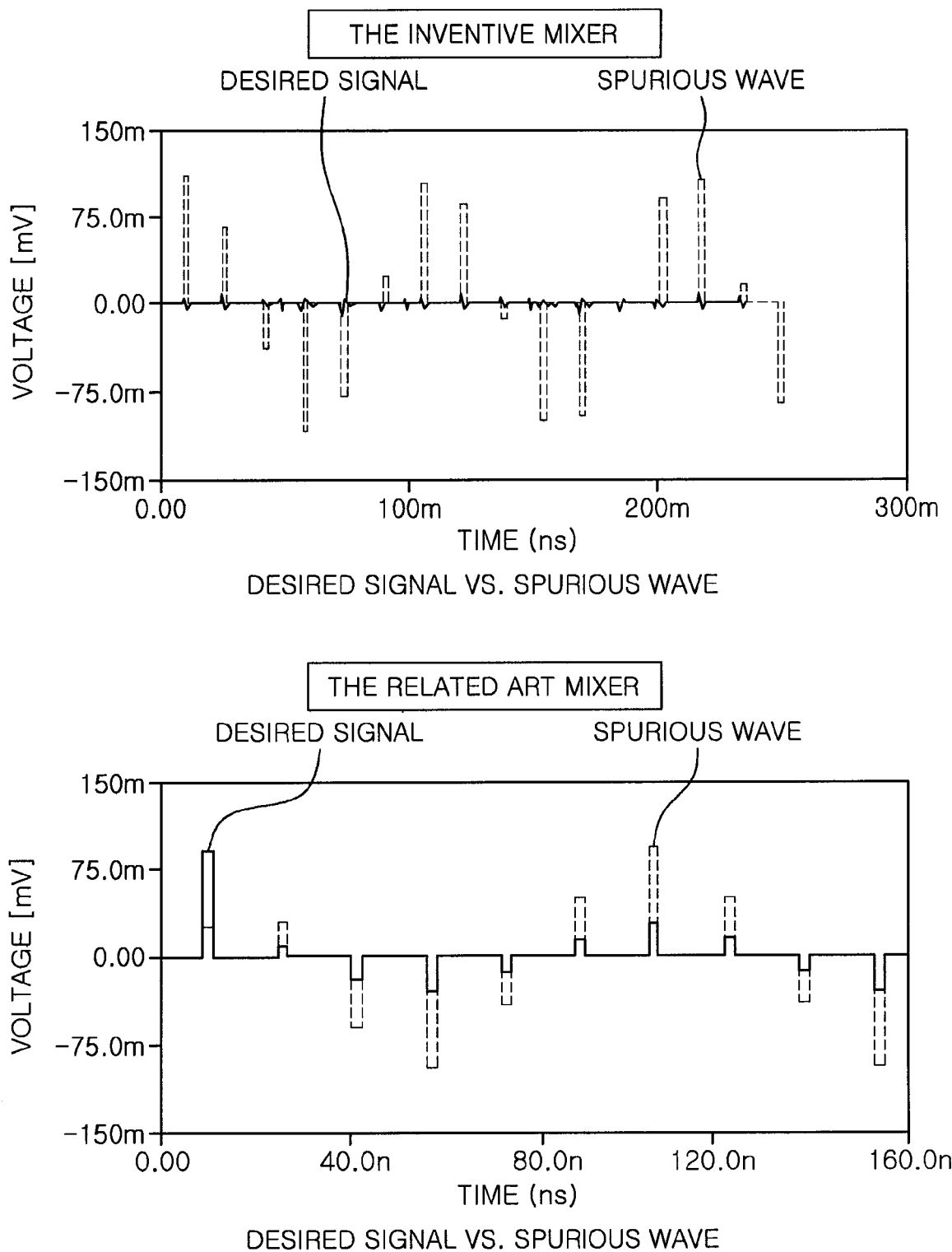
FIG. 9A illustrates the level of a desired signal vs the level of an undesired wave in a current sampling mixer of the present invention and the related art mixer.
Figure 9B:
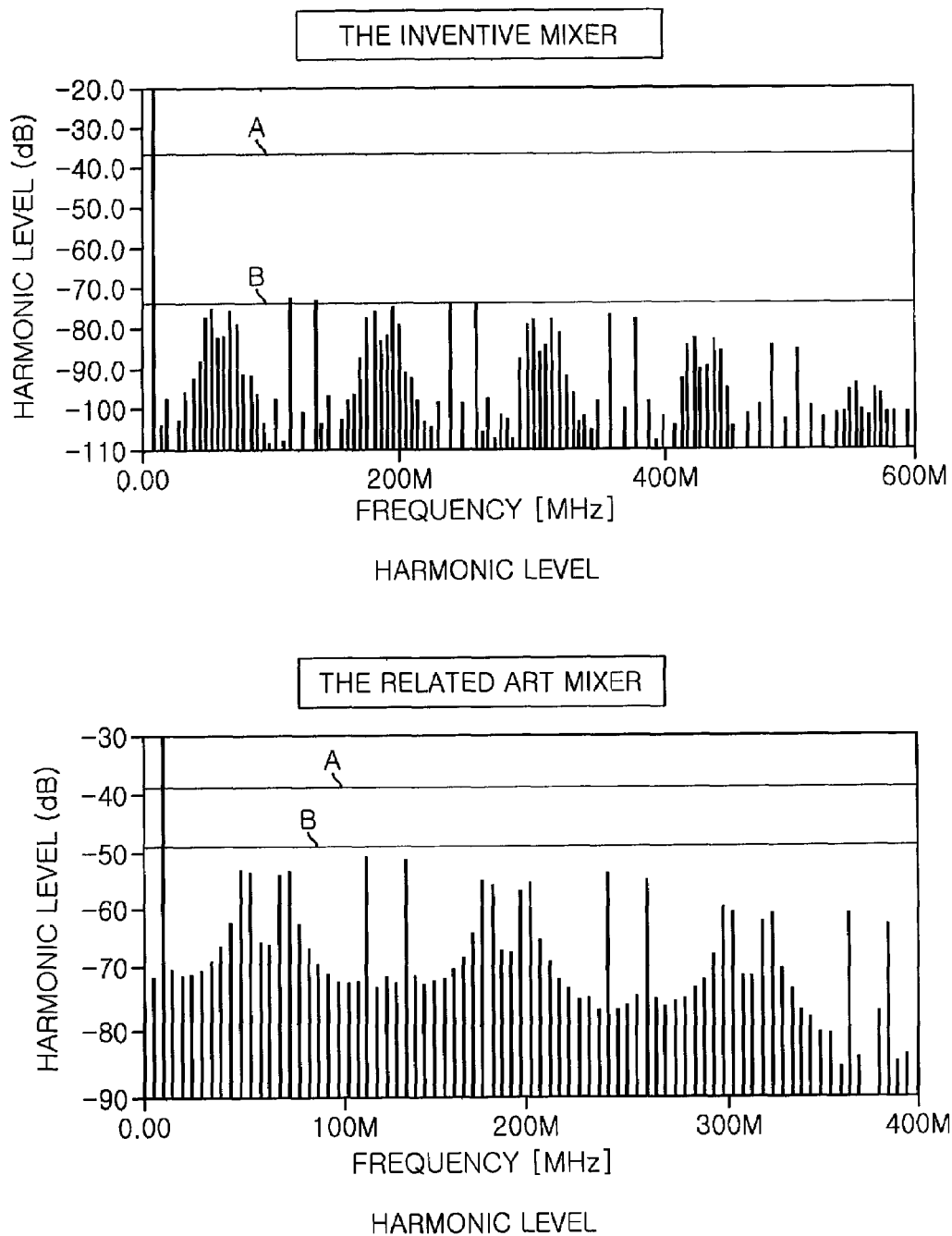
FIG. 9B illustrates the level of a harmonic wave in a current sampling mixer of the present invention and the related art mixer.

FIG. 9A is a graph showing a comparison between a level of a desired signal and a level of a spurious wave in the inventive current sampling mixer and the related art mixer. FIG. 9B showing a graph showing a comparison of a level of a harmonic wave in the inventive current sampling mixer and the related art mixer.

Hereinafter, the operation and effect of the current sampling mixer according to the present invention will be described in detail with reference to the accompanying drawings.

The current sampling mixer of the present invention uses a weight value scheme that gives a weight value to a post-capacitor selected among capacitors in the output by changing a structure of a current sampler.

The current sampler uses a scheme that stores continual samples simultaneously while converting a RF signal into a desired intermediate frequency (IF) signal, and performs a finite impulse response (FIR) filter function via a sum process.

The weight value giving scheme gives different weight values to the post-capacitors and obtains the effect that an oscillation signal has a waveform such as a square wave, thereby rejecting a harmonic.

In embodiments of the present invention, for convenience, a case where a chare selector includes 8 charge switches, a capacitor circuit includes 8 capacitor pairs, a weight selector includes 8 weight switches, and a filter circuit includes 8 output switches will be described as an example.

First, an embodiment of the present invention will be described with reference to FIG. 4.

Referring to FIG. 4, in the current sampling mixer according to an embodiment of the present invention, the first current source IS10 connected to the first input terminal RF+ provides the positive current of the input signal to the charge selector 110, and the second current source IS20 connected to the second input terminal RF− provides the negative current of the input signal to the charge selector 110.

The switch controller 400 of the present invention generates the first to eighth charge selection signals SS11 to SS18 which sequentially switch on the first to eighth charge switches SW11 to SW18 during the charge time, and generates the weight selection signal SS120 which switches on the first to eighth weight switches SW21 to SW28 during the chare time.

Accordingly, the first to eighth charge switches SW11 to SW18 of the charge selector 110 are sequentially turned on by the first to eighth charge selection signals SS11 to SS18, and the first to eighth weight switches SW21 to SW28 are sequentially turned on by the weight selection signal SS120. Therefore, electric charges are charged in the first to eighth capacitor pairs of the capacitor circuit 120 by a current flowing through the charge selector 110.

At this point, since the first to eighth capacitor pairs of the capacitor circuit 120 have the same capacitance, the same amount of electric charges is charged in the first to eighth capacitor pairs of the capacitor circuit 120 by the first and second current source IS10 and IS20.

The switch controller 400 generates the weight selection signal SS120 which switches off the first to eighth weight switches SW21 to SW28 at the sum output time after the charge time, generates the output selection signal SS130 which simultaneously switches on the first to eighth output switches SW31 to SW38, and generates the reset signal Srst during between the sum output time and the charge time, to output the generated signals.

Accordingly, all the first to eighth weight switches SW21 to SW28 are switched off, and all the first to eighth output switches SW31 to SW38 are switched on.

The first to eighth weight switches SW21 to SW28 are switched off so that the pre-capacitor and post-capacitor of each of the first to eighth capacitor pairs are separated from each other and all the first to eighth output switches SW31 to SW38 are switched on, and thus the filter circuit 140 outputs the sum of currents corresponding to an amount of electric charges charged in the post-capacitor of the first to eighth capacitor pairs.

In this way, a filtering process can be performed through a sum output process, and a harmonic rejection function can be performed by giving a weight value to the post-capacitors.

Hereinafter, another embodiment of the present invention will be described with reference to FIGS. 5 to 9.

Referring to FIGS. 5 to 9, in the current sampling mixer according to another embodiment of the present invention, the first current source IS10 connected to the first input terminal RF+ provides the positive current of the input signal to the first current sampling mixer 100 and the second current sampling mixer 200, and the second current source IS20 connected to the second input terminal RF− provides the negative current of the input signal to the first current sampling mixer 100 and the second current sampling mixer 200.

The switch controller 400 simultaneously controls the charge of the first current sampling mixer 100 and the sum output of the second current sampling mixer 200 during the first charge time.

Accordingly, the first current sampling mixer 100 performs a charge operation and simultaneously the second current sampling mixer 200 performs a sum output operation. Since the charge operation of the first current sampling mixer 100 is the same as an operation described in an embodiment of the present invention, a duplicate description is omitted.

In a case where the first current sampling mixer 100 includes the reset circuit, the switch controller 400 generates the reset signal Srst and outputs it to the reset circuit during between the sum output time and the next charge time, i.e., during the second charge time TC2.

At this point, the reset circuit is switched on by the reset signal Srst to discharge electric charges charged in the capacitor circuit of the first current sampling mixer 100, thereby preparing the next charge operation.

The switch controller 400 simultaneously controls the sum output of the first current sampling mixer 100 and the charge of the second current sampling mixer 200 during the second charge time.

Accordingly, the second current sampling mixer 200 performs a charge operation and simultaneously the first current sampling mixer 100 performs a sum output operation. Since the charge operation of the second current sampling mixer 200 is the same as an operation described in an embodiment of the present invention, a duplicate description is omitted.

In a case where the second current sampling mixer 200 includes the reset circuit, the switch controller 400 generates the reset signal Srst and outputs it to the reset circuit during between the sum output time and the next charge time, i.e., during the first charge time TC1.

At this point, the reset circuit is switched on by the reset signal Srst to discharge electric charges charged in the capacitor circuit of the second current sampling mixer 200 to a ground, thereby preparing the next charge operation.

Referring to FIG. 6, in a case where the current sampling mixer of the present invention includes the first current sampling mixer 100 and the second current sampling mixer 200 as illustrated in FIG. 5, each of the first and second current sampling mixers 100 and 200 sequentially performs the charge operation, the output operation and the reset operation.

For example, during the first charge time TC1 in which the charge operation is performed in the first current sampling mixer 100, the second current sampling mixer 200 sequentially performs the sum output operation and the reset operation. Moreover, during the second charge time TC2 in which the charge operation is performed in the second current sampling mixer 200, the first current sampling mixer 100 sequentially performs the sum output operation and the reset operation.

Referring to FIG. 7, the switch controller 400 generates the first to eighth charge selection signals SS11 to SS18 which sequentially switch on the charge switches SW11 to SW18 of the charge selector 110 of the first current sampling mixer 100 during the first charge time TC1, and simultaneously generates the weight selection signal SS120 which switches on the weight switches SW21 to SW28 of the weight selector 130 of the first current sampling mixer 100.

The switch controller 400 generates the output selection signal SS130 which simultaneously switches on the output switches SW31 to SW38 of the filter circuit 140 of the first current sampling mixer 100 and simultaneously outputs the weight selection signal S120 as the switch off signal, during the second charge time TC2. Moreover, the switch controller 400 generates and outputs reset signals Srst1 and Srst2 before the next charge time after the sum output time.

Accordingly, after the sum output of each of the first and second current sampling mixers 100 and 200, which reset and discharge a corresponding capacitor circuit for the accuracy of the next charge operation.

In more detail, the switch controller 400 of FIG. 4 generates the first to eighth switch signals SS11 to SS18 which sequentially switch on the first to eighth weight switches SW21 to SW28 of the weight selector 130 to thereby provide the generated signals to the weight selector 130, and generates the output selection signal SS130 which simultaneously switches on the first to eighth output switches SW31 to SW38 of the filter circuit 140 to thereby provide the generated signal to the first to eighth output switches SW31 to SW38 of the filter circuit 140 during the output time after the first charge time TC1.

Hereinafter, the operation of the first current sampling mixer 100 will be described according to the control of the switch controller 400. The following description can be applied to each of the embodiments of the present invention.

Referring to FIG. 4, the weight selector 130 includes the weight switches SW21 to SW28 connected to the current path between the pre-capacitor and post-capacitor of each of the first to eighth capacitor pairs.

The respective first to eighth weight switches SW21 to SW28 are sequentially switched on by the first to eighth switch signals SS11 to SS18 from the switch controller 400 for the charge, and the first to eighth output switches SW31 to SW38 of the filter circuit 140 are switched off.

At this point, the RF signal is converted into the IF signal while passing through the weight selector 130.

When the first to eighth weight switches SW21 to SW28 of the weight selector 130 are switched on, the current of the input signal by the first current source IS10 connected to the first input terminal FR+ sequentially passes through the first to fourth weight switches SW21 to SW24 and is charged in the pre-capacitors C11a to C14a and post-capacitors C11b to C14b of the capacitor circuit 120.

Subsequently, the current of the input signal by the second current source IS20 connected to the second input terminal FR− sequentially passes through the fifth to eighth weight switches SW25 to SW28 and is charged in the pre-capacitors C21a to C24a and post-capacitors C21b to C24b of the capacitor circuit 120.

Herein, the fact that a negative (−) current flowing in the opposition direction of the first current source IS10 is used as the second current source IS20 connected to the second input terminal RF− is for implementing the negative component of the sine wave.

In this way, after all the pre-capacitors C11a to C14a and C21a to C24a and post-capacitors C11b to C14b and C21b to C24b of the capacitor circuit 120 are charged, all the first to eighth weight switches SW21 to SW28 are switched off by the first to eighth oscillation signals SS11 to SS18 for the sum output, and all the first to eighth output switches SW31 to SW38 of the filter circuit 140 are switched on.

All the first to eighth output switches SW31 to SW38 of the filter circuit 140 are switched on, and sum amounts of electric charges (Q=CV) of the IF signal charged in the post-capacitors C11b to C14b and C21b to C24b of the capacitor circuit 120 to thereby output it through the output terminal IFout connected to the output capacitor Cout. At this point, a filtering operation is performed through the sum operation.

In the weight value, the first to eighth capacitor pairs of the capacitor circuit 120 have the same capacitance, and the first to eighth post-capacitors have the weight value corresponding to the absolute value of the sine wave of one period in disposition order. Each of the weight values of the first to eighth post-capacitors corresponds to the absolute value of the same phase difference interval in the sine wave of one period.

Referring to FIG. 8, in a case where the capacitor pairs include the first to eighth capacitor pairs, the weight selector 130 may include the first to eighth post-capacitors C11 to C14 and C21 to C24.

In this case, the first to eighth post-capacitors C11 to C14 and C21 to C24 may have the weight value corresponding to the absolute value of the sine wave of one period in disposition order. Each of the weight values of the first to eighth post-capacitors C11 to C14 and C21 to C24 may correspond to the absolute value of the same phase difference (45 degrees) interval in the sine wave of one period.

For example, C11 corresponds to 0 which is the absolute value of $\sin(0°)$, C12 corresponds to $1/\sqrt{2}$ which is the absolute value of $\sin(45°)$, C13 corresponds to 1 which is the absolute value of $\sin(90°)$, and C14 corresponds to $1/\sqrt{2}$ which is the absolute value of $\sin(135°)$. Furthermore, C21 corresponds to 0 which is the absolute value of $\sin(180°)$, C22 corresponds to $1/\sqrt{2}$ which is the absolute value of $\sin(225°)$, C23 corresponds to 1 which is the absolute value of $\sin(270°)$, and C24 corresponds to $1/\sqrt{2}$ which is the absolute value of $\sin(315°)$.

That is, since the first to eighth capacitor pairs of the capacitor circuit 120 of the present invention have the same capacitance, the same samples only are accumulated.

Herein, to obtain a desired coefficient, the capacitor circuit 120 separates input capacitors, and selects and outputs electric charges (Q) stored in output capacitors.

FIG. 9A and FIG. 9B is a graph showing a comparison between a harmonic conversion of the inventive multi-phase current sampling mixer and the harmonic conversion of the related art current sampling mixer.

Compared the level of the spurious wave with respect to the desired signal of the related art mixer with the level of the spurious wave with respect to the desired signal of the inventive mixer referring to FIG. 9A, it can be seen from FIG. 9A that the level of the spurious wave of the related art mixer is considerably high and the level of the spurious wave of the inventive mixer is considerably low.

Moreover, the frequency of the oscillation signal SS1 is 125 MHz (NH×fs=125 MHz), the frequency of the input RF signal is 115 MHz, and the frequency of the IF signal is 10 MHz (125−115=10 MHz). Herein, when the frequency of the RF signal is input as 365 MHz on the same oscillation signal SS1, FIG. 9A and FIG. 9B show the simulation result of amounts converted by the cubic harmonic of the oscillation signal SS1. A harmonic conversion is the conversion result of 375 MHz (3×125=375 MHz) and 365 MHz, and has the same IF signal having a frequency of 10 MHz.

Finally, the improved characteristics of 27 dB appear, and cubic and quintic harmonic rejection may completely be removed theoretically. However, the rate of rejection is somewhat reduced by the parasitic component of an analog circuit.

As described above, when using multi-phase, the harmonic component of the oscillation signal can be rejected, and when increasing the number of multi-phases, a high-order harmonic component can be rejected. The mixer of the present invention can apply a current sampling mixing scheme being a narrowband technology to broadband. A discrete analog scheme has more superior merits than the existing analog mixing scheme, but has difficulty in being applied to broadband. Accordingly, the mixer of the present invention improves a demerit that it is difficult to apply the discrete analog scheme to broadband, and thus enables to apply the superior merits of the discrete analog scheme to broadband.

The current sampling mixer of the present invention can change a structure of a current sampler including a plurality of capacitors to select and sum capacitors having a weight value given in the output, thereby performing a finite impulse response filter function and a harmonic rejection function.

While the present invention has been shown and described in connection with the exemplary embodiments, it will be apparent to those skilled in the art that modifications and variations can be made without departing from the spirit and scope of the invention as defined by the appended claims.

What is claimed is:

1. A current sampling mixer with harmonic rejection, comprising:
   a first current source connected to a first input terminal to provide a positive current of an input signal;
   a second current source connected to a second input terminal to provide a negative current of the input signal;
   a charge selector comprising a plurality of charge switches connected to the respective first and second current sources in parallel, wherein the charge switches are sequentially turned on during a charge time and are simultaneously turned off during a sum output time;
   a capacitor circuit comprising a plurality of capacitor pairs connected to the respective chare switches, wherein each of the capacitor pairs comprises a pre-capacitor and a post-capacitor;
   a weight selector comprising a plurality of weight switches connected to a current path between the pre-capacitor and post-capacitor of each of the capacitor pairs, wherein the weight switches are turned on during the charge time and are turned off for giving a weight during the sum output time; and
   a filter circuit comprising a plurality of output switches connected between the respective post-capacitors of the capacitor circuit and an output terminal, wherein the output switches are simultaneously turned on for a sum output during the sum output time.

2. The current sampling mixer of claim 1, wherein the current sampling mixer further comprises an output capacitor connected to the output terminal.

3. The current sampling mixer of claim 1, wherein the capacitor pairs have the same capacitance.

4. The current sampling mixer of claim 1, wherein the post-capacitors of the capacitor pairs have a weight value corresponding to an absolute value of a sine wave of one period in disposition order.

5. The current sampling mixer of claim 4, wherein each of the weight values of the post-capacitors corresponds to an absolute value of the same phase difference interval in the sine wave of one period.

6. A current sampling mixer with harmonic rejection, comprising:
   a first current source connected to a first input terminal to provide the positive current of an input signal;
   a second current source connected to a second input terminal to provide a negative current of the input signal;
   a charge selector comprising a plurality of charge switches connected to the respective first and second current sources in parallel, wherein the charge switches are sequentially turned on during a charge time and are simultaneously turned off during a sum output time;
   a capacitor circuit comprising a plurality of capacitor pairs connected to the respective chare switches, wherein each of the capacitor pairs comprises a pre-capacitor and a post-capacitor;
   a weight selector comprising a plurality of weight switches connected to a current path between the pre-capacitor and post-capacitor of each of the capacitor pairs, wherein the weight switches are turned on during the charge time and are turned off for giving a weight during the sum output time;
   a filter circuit comprising a plurality of output switches connected between the respective post-capacitors of the capacitor circuit and an output terminal, wherein the output switches are simultaneously turned on for a sum output during the sum output time; and
   a reset circuit configured to reset the capacitor pairs of the capacitor circuit during between the sum output time and the charge time.

7. The current sampling mixer of claim 6, wherein the current sampling mixer further comprises an output capacitor connected to the output terminal.

8. The current sampling mixer of claim 6, wherein the capacitor pairs have the same capacitance.

9. The current sampling mixer of claim 8, wherein each of weight values of the post-capacitors corresponds to an absolute value of the same phase difference interval in the sine wave of one period.

10. A current sampling mixer with harmonic rejection, comprising:
    a first current source connected to a first input terminal to provide the positive current of an input signal;
    a second current source connected to a second input terminal to provide a negative current of the input signal;
    a charge selector comprising a plurality of charge switches connected to the respective first and second current sources in parallel, wherein the charge switches are sequentially turned on during a charge time and are simultaneously turned off during a sum output time;
    a capacitor circuit comprising a plurality of capacitor pairs connected to the respective chare switches, wherein each of the capacitor pairs comprises a pre-capacitor and a post-capacitor;
    a weight selector comprising a plurality of weight switches connected to a current path between the pre-capacitor and post-capacitor of each of the capacitor pairs, wherein the weight switches are turned on during the charge time and are turned off for giving a weight during the sum output time;
    a filter circuit comprising a plurality of output switches connected between the respective post-capacitors of the capacitor circuit and an output terminal, wherein the output switches are simultaneously turned on for a sum output during the sum output time;
    a reset circuit configured to reset the capacitor pairs of the capacitor circuit during between the sum output time and the charge time; and
    a switch controller configured to generate a charge selection signal which sequentially switches on the charge switches during the charge time, generate a weight selection signal which switches on the weight switches during the charge time and switches off the weight switches at the sum output time after the charge time, generate an output selection signal which simultaneously switches on the output switches during the sum output time, and generate a reset signal during between the sum output time and the charge time, to output the generated signals.

11. The current sampling mixer of claim 10, wherein the current sampling mixer further comprises an output capacitor connected to the output terminal.

12. The current sampling mixer of claim 10, wherein the capacitor pairs have the same capacitance.

13. The current sampling mixer of claim 10, wherein each of weight values of the post-capacitors corresponds to an absolute value of the same phase difference interval in the sine wave of one period.

14. A current sampling mixer with harmonic rejection, comprising:
    a first current source connected to a first input terminal to provide the positive current of an input signal;

a second current source connected to a second input terminal to provide a negative current of the input signal;

a charge selector comprising a plurality of charge switches connected to the respective first and second current sources in parallel, wherein the charge switches are sequentially turned on during a charge time and are simultaneously turned off during a sum output time;

a capacitor circuit comprising a plurality of capacitor pairs connected to the respective chare switches, wherein each of the capacitor pairs comprises a pre-capacitor and a post-capacitor;

a weight selector comprising a plurality of weight switches connected to a current path between the pre-capacitor and post-capacitor of each of the capacitor pairs, wherein the weight switches are turned on during the charge time and are turned off for giving a weight during the sum output time;

a filter circuit comprising a plurality of output switches connected between the respective post-capacitors of the capacitor circuit and an output terminal, wherein the output switches are simultaneously turned on for a sum output during the sum output time;

a reset circuit configured to reset the capacitor pairs of the capacitor circuit during between the sum output time and the charge time; and a switch controller configured to generate a charge selection signal which sequentially switches on the charge switches during the charge time, generate a weight selection signal which switches on the weight switches during the charge time and switches off the weight switches at the sum output time after the charge time, generate an output selection signal which simultaneously switches on the output switches during the sum output time, and generate a reset signal during between the sum output time and the charge time, to output the generated signals, wherein the post-capacitors of the capacitor pairs have a weight value corresponding to an absolute value of a sine wave of one period in disposition order.

15. The current sampling mixer of claim 14, wherein the current sampling mixer further comprises an output capacitor connected to the output terminal.

16. The current sampling mixer of claim 14, wherein the capacitor pairs have the same capacitance.

17. The current sampling mixer of claim 16, wherein each of weight values of the post-capacitors corresponds to an absolute value of the same phase difference interval in the sine wave of one period.

18. A current sampling mixer with harmonic rejection, comprising:

a first current source connected to a first input terminal to provide the positive current of an input signal;

a second current source connected to a second input terminal to provide a negative current of the input signal;

a first current sampling mixer comprising a plurality of first capacitor pairs connected to the respective first and second current sources in parallel, wherein the first current sampling mixer charges the first capacitor pairs during a first charge time, selects weight charge values of charge values which are charged in the first capacitor pairs during a second charge time after the first charge time, and outputs the selected weight charge values;

a second current sampling mixer comprising a plurality of second capacitor pairs connected to the respective first and second current sources in parallel, wherein the second current sampling mixer charges the second capacitor pairs during the second charge time, selects weight charge values of charge values which are charged in the second capacitor pairs during the first charge time, and outputs the selected weight charge values; and a switch controller configured to simultaneously control the charge of the first current sampling mixer and the sum output of the second current sampling mixer during the first charge time, and simultaneously control the sum output of the first current sampling mixer and the charge of the second current sampling mixer during the second charge time.

19. The current sampling mixer of claim 18, wherein each of the first and second current sampling mixer comprises:

a charge selector comprising a plurality of charge switches connected to the respective first and second current sources in parallel, wherein the charge switches are sequentially turned on during a charge time and are simultaneously turned off during a sum output time;

a capacitor circuit comprising a plurality of capacitor pairs connected to the respective chare switches, wherein each of the capacitor pairs comprises a pre-capacitor and a post-capacitor;

a weight selector comprising a plurality of weight switches connected to a current path between the pre-capacitor and post-capacitor of each of the capacitor pairs, wherein the weight switches are turned on during the charge time and are turned off for giving a weight during the sum output time; and a filter circuit comprising a plurality of output switches connected between the respective post-capacitors of the capacitor circuit and an output terminal, wherein the output switches are simultaneously turned on for a sum output during the sum output time.

20. The current sampling mixer of claim 19, wherein the first current sampling mixer comprises a first reset circuit configured to reset the capacitor pairs of the capacitor circuit during between the sum output time and the charge time, wherein the second current sampling mixer comprises a second reset circuit configured to reset the capacitor pairs of the capacitor circuit during between the sum output time and the charge time.

21. The current sampling mixer of claim 19, wherein the switch controller generates a charge selection signal which sequentially switches on the charge switches of the charge selector of the first current sampling mixer and simultaneously generates a weight selection signal which switches on the weight switches of the weight selector of the first current sampling mixer, during the first charge time, generates an output selection signal which simultaneously switches on the output switches of the filter circuit of the first current sampling mixer and simultaneously outputs the weight selection signal as a switch off signal, during the second charge time, and generates and outputs a reset signal during between the sum output time and the charge time.

22. The current sampling mixer of claim 19, wherein the capacitor pairs have the same capacitance.

23. The current sampling mixer of claim 19, wherein the post-capacitors of the capacitor pairs have a weight value corresponding to an absolute value of a sine wave of one period in disposition order.

24. The current sampling mixer of claim 23, wherein each of the weight values of the post-capacitors corresponds to an absolute value of the same phase difference interval in the sine wave of one period.

* * * * *